United States Patent [19]
Bayer et al.

[11] Patent Number: 4,569,743
[45] Date of Patent: Feb. 11, 1986

[54] METHOD AND APPARATUS FOR THE SELECTIVE, SELF-ALIGNED DEPOSITION OF METAL LAYERS

[75] Inventors: Thomas Bayer, Boeblingen; Georg Kraus, Wildberg; Ulrich Kuenzel, Kusterdingen; Gisela Renz, Grafenau; Rolf Schaefer, Gaertringen-Rohrau, all of Fed. Rep. of Germany

[73] Assignee: International Business Machines Corporation, Armonk, N.Y.

[21] Appl. No.: 649,255

[22] Filed: Sep. 10, 1984

[30] Foreign Application Priority Data

Sep. 23, 1983 [EP] European Pat. Off. ........ 83109479.2

[51] Int. Cl.[4] ...................... C23C 14/00; C23C 14/34; C23C 14/46
[52] U.S. Cl. ................................. 204/192 R; 204/298
[58] Field of Search ............................ 204/192 R, 298

[56] References Cited

U.S. PATENT DOCUMENTS

| | | | |
|---|---|---|---|
| 3,321,390 | 5/1967 | Weber | 204/164 |
| 3,707,452 | 12/1972 | Lester et al. | 204/298 |
| 3,986,944 | 10/1976 | Gould | 204/192 C |
| 4,013,830 | 3/1977 | Pinch et al. | 204/192 C X |

FOREIGN PATENT DOCUMENTS

| | | | |
|---|---|---|---|
| 0002383 | 6/1979 | European Pat. Off. | 204/298 |
| 1947480 | 10/1970 | Fed. Rep. of Germany | 427/248.1 |
| 1128002 | 9/1968 | United Kingdom | 427/250 |

OTHER PUBLICATIONS

Robert W. Berry et al., "Thin Film Technology", pp. 216–219, (1968).
John L. Vossen et al., "Thin Film Processes", pp. 11–36, (1978).

*Primary Examiner*—G. L. Kaplan
*Attorney, Agent, or Firm*—Douglas A. Lashmit

[57] ABSTRACT

A method and apparatus for the selective deposition of metal layers on a substrate. At least one metal layer is deposited in a self-aligned manner on conductive regions on the surface of isolating or semiconductive substrates, for which purpose the conductive regions are arranged facing a metal plate having at least one layer of the metal to be deposited, and Tesla currents are generated between the metal plate and the regions to be coated. The apparatus for implementing the method includes a metal plate, a Tesla transformer which is coupled to the metal plate or to a metal grid, spaced apart from the surface of the metal plate away from the conductive regions, having closely adjacent and regularly distributed spikes pointing towards the metal. This method may be used, for example, to produce conductors on or in ceramic modules, circuit cards and semiconductor elements.

25 Claims, 1 Drawing Figure

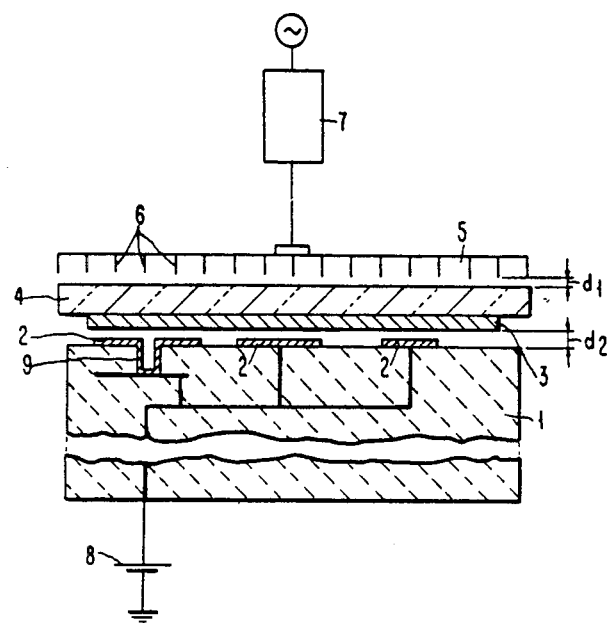

METHOD AND APPARATUS FOR THE SELECTIVE, SELF-ALIGNED DEPOSITION OF METAL LAYERS

BACKGROUND OF THE INVENTION

The invention concerns a method for the selective and self-aligned deposition of at least one metal layer on conductive regions on the surface of isolating or semiconductive substrates, and an apparatus for implementing the method.

Previously, methods of the above-mentioned kind could be implemented only on a wet chemical basis by electrolessly or electrolytically depositing a metal from the solution of one of its salts on regions made conductive or activated on the surface of an isolating substrate. Wet chemical processes, however, have the disadvantage that the substrates to be coated become contaminated, which may impair the function of the components to be manufactured and give rise to ecological problems when the baths used for coating are disposed of. Dry coating methods, such as cathode sputtering and vapor deposition, are primarily used to deposit metal layers on the entire surface of a substrate. Although these dry methods permit the selective deposition of metal on substrates with the aid of a metal mask whose openings correspond to the metal pattern to be deposited and which is positioned on or at a short distance from the substrate, such metal masks are relatively complicated to manufacture and their alignment relative to the substrate has to be very accurate. If the substrate, prior to the deposition of the metal, has to be subjected to steps in which its shrinkage is not fully controllable, as is the case, for instance, with ceramic or plastic substrates, then metal layers, whose structures correspond to the structures already existing on the substrate, can be selectively deposited only if the permissible manufacturing tolerances are very high. As the trend towards microminiaturization and thus to ever higher packing densities is increasing and the conductor widths are decreasing, such generous manufacturing tolerances are no longer practicable.

SUMMARY OF THE INVENTION

It is the object of the invention to provide a simple method and apparatus for reproducibly metallizing conductive regions on the surface of nonconductive or semiconductive substrates, observing tight manufacturing tolerances and without contaminating the substrates.

The method according to the present invention is a dry method. Consequently, the substrates to be coated are not contaminated during its application, and since there are no baths to be disposed of, there are no ecological problems. For selective metallization, the present method does not require masks, which leads not only to savings in the manufacturing costs of the masks but it is also uncritical if the substrates and thus the conductive surface regions to be metallized shrink in a manner that is not fully controllable in steps prior to metallization. Such shrinking may occur, for example, if the substrate is made of a ceramic or plastic material. This method subjects the materials concerned to little wear, and it is flexible with regard to the substrate materials, the materials of which the conductive regions are made, and the metals that are deposited in layer form. The substrates may be made of an isolating material, such as a plastic or ceramic material, or of a semiconductive material, such as silicon, and the conductive regions may be made of any sufficiently conductive material, preferably a metal, and a vast number of metals are suitable for deposition, in particular all those that are employed for manufacturing integrated and printed circuits.

The method according to the invention is particularly advantageous where a metallization consists of two or more layers of different metals, since it is possible, provided a suitably structured metal plate is used, to deposit such layer sequences in a single step. As the present method may be applied at normal pressure in air by means of a commercially available Tesla transformer without complicated alignment means, the apparatus necessary for its implementation is very simple and inexpensive. However, the apparatus may also include an evacuatable reaction chamber in which the metal is deposited and at which a gas inlet may be provided for adding defined quantities of gas. The growth rate may be controlled as a function of the gas pressure and the gas used. If the method according to the invention is applied in a vacuum or in an atmosphere without oxygen, the gas used is prevented from becoming included in the metal being grown. The method may also be used to produce conductors on or in multilayer modules, circuit cards and semiconductor elements, to reproduce metallic structures, and as a repair means.

BRIEF DESCRIPTION OF THE DRAWING

The invention will be described below by way of examples with reference to the accompanying drawing, which is a schematic cross-sectional view of metal deposition apparatus according to one embodiment of the present invention.

DETAILED DESCRIPTION OF THE INVENTION

Referring now to the drawing, there is shown deposition apparatus which includes a metal plate 3 of the material to be transferred. The metal, according to the embodiment shown in the drawing, is deposited on an insulating plate 4, made, for example, of glass. The thickness of the insulating plate 4, which is preferably 1 mm, ranges from 0.1 to 3 mm. The material, of which the metal plate 3 consists, may be deposited on the insulating plate 4, for example, by cathode sputtering or vapor deposition. The metal plate 3 consists either of one metal or of two or more layers of different metals. The insulating plate 4 is optional. Arrangements are also possible where in lieu of the combination of the plate 4 and the metal plate 3 there is only a metal plate 3 of adequate mechanical stability. In the present embodiment the combination of the metal plate 3 and the insulating plate 4 is arranged such that the metal plate 3 projects downwards. At a short distance from the upper surface of plate 4 a metal grid 5 is provided which is connected to a Tesla transformer 7. The metal grid 5 may include a large number of spikes 6 which are evenly distributed across the grid and which point at the dielectric plate 4. Instead of the metal grid 5, a wire bundle may be used, with the wire tips pointing at the surface of the isolating plate 4 and the wire bundle being spread such that the projection of the wire tips on the surface of the isolating plate 4 constitutes an evenly distributed dot pattern. The distance $d_1$ between the spikes or tips and the surface of plate 4 is $\geq 1$ mm. For embodiments not requiring an insulating plate 4, the Tesla transformer 7 may also be directly coupled to the metal plate 3. The Tesla transformer 7 may be a commercially available high-frequency vacuum tester, such as those marketed by Leybold-Heraeus with the type designation VP23 for leakage tests in vacuum glass apparatus, for example. The substrate 1, having conductive regions 2 on the surface facing the metal plate 3, is arranged at a short distance $d_2$ from the metal plate 3. Distance $d_2$ preferably ranges from about 10 to 100 $\mu$m. The conductive regions are electrically connected to a bias source 8, by means of which the conductive regions may be linked to a fixed positive potential. Alternatively, the conductive regions 2 may be grounded or be connected to a floating potential. The apparatus may also include an evacuatable reaction chamber (not shown) in which the metal grid 5, the insulating plate 4, the metal plate 3, and the substrates 1 are arranged, to which a vacuum pump is connected, and which has a gas inlet.

The method according to the invention will now be described. This description is based on the illustrated arrangement both with and without an evacuatable reaction chamber. It is noted, however, that arrangements differing from the illustrated one with respect to the other above-mentioned alternatives are equally suitable for implementing the method.

The substrates, on whose surface the conductive regions are located, may be made of insulating or semiconductive materials. Suitable for this purpose are, for example, plastics, ceramic material, glass ceramic material, and silicon. Metallization mainly serves to form the conductors, to reinforce the solder points or coat them with solderable material, and to fill holes 9 in insulating layers between two metallization planes with metal. The conductive regions 2 are structured accordingly, i.e., on the surface facing the metal plate. They cover the regions in which conductors or solder points are to be generated, and they also cover the walls in the hole 9. The conductive regions 2 are thin films of any suitable material, such as molybdenum or aluminum. The metal plate 3 deposited on the insulating plate 4 is structured to suit the metallization to be deposited. Typical metals for deposition on the conductive regions 2 are copper, gold, chromium, silver, and nickel. If only one metal is to be deposited on the substrate 1, metal plate 3, too, consists of only one metal whose layer thickness must be at least equal to that of the deposited metallization. If two or more metal layers are to be deposited on the substrate 1, these layers are formed on plate 4 in an order reverse to that in which they are subsequently deposited on the substrate 1. For this purpose, the thicknesses of the layers in the metal plate 3 are the same as those of the metal layers on the substrate 1 after completion of metallization. The adhesion of the metal to plate 4 influences the rate of metallization.

Usually, the method according to the invention is implemented at normal pressure and in air. However, for influencing, for example, the rate of metallization of the substrate and for preventing the inclusion of oxygen in the metal deposited in the substrate, it is also possible to metallize in a vacuum and/or in an inert atmosphere. As previously mentioned, the apparatus used in this case to implement the method according to the invention is slightly more elaborate. The Tesla voltage applied is between 10 and 100 KV, preferably about 50 KV, at a frequency ranging from 400 to 500 kHz, and the power density is between 0.1 and 100 W/cm$^2$, preferably about 5 W/cm$^2$. The bias applied to the conductive regions 2 is between 0 and 100 V. The edge definition of the pattern generated during metallization and its compliance with the pattern forming the conductive regions, respectively, improves as the distance $d_2$ is decreased. The material of the metal plate 3 facing the conductive regions 2 is deposited on the conductive regions 2 by the method according to the invention in fractions of seconds. The deposition rate may be controlled, if necessary, by varying in particular the following parameters: the distance $d_2$, the power density, the adhesion of the film to the insulating layer 4, the bias at the conductive regions, the pressure, and the gas atmosphere. Layers to be transferred may have thicknesses of the order of micrometers. By means of this method, it is only the conductive regions 2 that are metallized, i.e., the method is deposited in a self-aligned manner.

In summary, the special advantages of the method according to the invention are that it is a dry method which may be implemented without the use of masks and in a self-aligned manner, that it permits selective metallization and also multi-layer selective metallization in a single step, and that the layers deposited on the conductive regions have a good adhesion. It has been found that the adhesion can be improved even further by a subsequent thermal treatment. The present method is particularly advantageous in the production of conductors on or in multi-layer modules and circuit cards and semiconductor elements, and for reproducing metallic structures, for example, for analysis purposes, for improving the contact of solder points, and as a repair means.

The method according to the invention will now be described as applied to the deposition of gold and/or gold and copper, using the apparatus shown in the drawing figure. The conductive regions 2 were grounded, the Tesla voltage was approximately 50 KV at 450 KHz, the power density was about 5 W/cm$^2$, and the distance $d_2$ about 10 $\mu$m. In the first four examples, the substrate 1 consisted of a ceramic material and the conductive regions 2 were printed on the substrate surface by means of a molybdenum paste. In the first example, the metal plate 3 consisted of a gold layer about 25 nm thick, in the second example, of about a 100 nm thick gold layer, in the third example, of about a 1 $\mu$m thick gold layer, and in the fourth example, of about a 25 nm thick copper layer adjoining plate 4, with about a 25 nm thick gold layer thereover. For the fifth example, the substrate 1 consisted of a silicon wafer including vapor-deposited aluminum lands, and the metal plate 3 consisted of a gold layer. In all five examples, the metal 3 facing the conductive regions 2 was deposited in fractions of seconds. The individual examples were each repeated several times, with the conductive regions 2 being either grounded or connected to a floating potential, and no differences were detected in the deposited layers. The transfer was effected with a very high pattern fidelity, i.e., the pattern generated during metallization corresponded exactly to the pattern formed by the conductive regions. The adhesion of the deposited metallization was satisfactory in all cases.

What is claimed is:

1. A method for the selective, self-aligned deposition of at least one metal on conductive regions on the surface of a substrate, comprising:
    positioning an insulating plate having thereon a layer of said at least one metal to be deposited facing and at a predetermined distance from said surface of said substrate; and generating a current between said plate and said conductive regions of said substrate by capacitively coupling an RF power source to said plate, thereby selectively transferring said at least one metal layer from said plate only to said conductive regions.

2. The method of claim 1, wherein said at least one metal is selected from the group consisting of silver, gold, nickel, chromium and copper.

3. The method of claim 1, wherein said step of generating a current comprises coupling a power source having a voltage of 10–100 kV, a frequency of 400–500 kHZ, and a power density of 0.1–100 W/cm$^2$ to said plate, and wherein the spacing between said plate and the surface of said substrate ranges from 5–100 $\mu$m.

4. The method of claim 3, wherein said step of generating a current comprises coupling a power source having a voltage of about 50 kV, a frequency of about 450 kHz, and a power density of about 5 W/cm$^2$ to said plate, and wherein the spacing between said plate and said substrate is about 10 $\mu$m.

5. The method of claim 3 or 4, further comprising:
coupling a bias potential ranging from 0–100 V to said conductive regions on said substrate.

6. The method of claim 5, wherein said plate has at least two layers of different metals formed thereon in the reverse order in which they are to be deposited on said conductive regions.

7. The method of claim 6, wherein said step of generating a current is implemented in an atmosphere comprising air.

8. The method of claim 7, further including the step of:
controlling the deposition rate of said at least one metal by regulating said bias potential.

9. The method of claim 8, further including the step of:
thermally treating said deposited metallization.

10. The method of claim 6 wherein said step of generating current is implemented in an atmosphere comprising an inert gas.

11. The method of claim 10, further including the step of:
controlling the deposition rate of said at least one metal by regulating said bias potential.

12. The method of claim 11, further including the step of:
thermally treating said deposited metallization.

13. A method for the selective, self-aligned deposition of at least one metal layer on conductive regions on the surface of a substrate, comprising:
positioning an insulating plate having thereon a layer of said at least one metal to be deposited facing and at a predetermined distance from said surface of said substrate;
generating a current between said plate and said conductive regions of said substrate by capacitively coupling an RF power source to said plate, thereby selectively transferring said at least one metal layer from said plate only to said conductive regions; and
coupling a bias potential to said conductive regions on said substrate.

14. The method of claim 13, wherein said step of generating a current comprises coupling a power source having a voltage of 10–100 kV, a frequency of 400–500 kHz, and a power density of 0.1–100 w/cm$^2$ to said plate, wherein the spacing between said plate and the surface of said substrate ranges from 5–100 $\mu$m, and wherein said bias potential ranges from 0–100 V.

15. The method of claim 14, wherein said at least one metal is selected from the group consisting of silver, gold, nickel, chromium and copper.

16. The method of claim 15, wherein said step of generating a current is implemented in an atmosphere comprising air.

17. The method of claim 15, wherein said step of generating a current is implemented in an atmosphere comprising an inert gas.

18. The method of claim 15, wherein said step of generating a current is implemented in substantially a vacuum.

19. The method of claim 16, 17 or 18, further including the step of thermally treating said deposited metallization.

20. The method of claim 19, further including the step of controlling the deposition rate of said at least one metal by regulating said bias potential.

21. Apparatus for the selective, self-aligned deposition of at least one metal layer on conductive regions on the surface of a substrate, comprising:
a metal plate formed of said at least one metal to be deposited adapted to be spaced apart from said conductive regions on the surface of said substrate;
an insulating plate affixed to the surface of said metal plate adapted to be opposite said substrate;
a metal grid spaced apart from the surface of said insulating plate opposite said metal plate; and
an RF power source connected to said metal grid.

22. The apparatus of claim 21, further comprising:
means for applying a bias potential to said conductive regions on the surface of said substrate.

23. The apparatus of claim 22, wherein said metal grid includes a plurality of regularly distributed, downwardly projecting spikes pointing at said metal plate.

24. The apparatus of claim 23, further including an evacuatable reaction chamber in which said at least one metal is deposited, said reaction chamber having a gas inlet for adding defined quantities of gas.

25. The apparatus of claim 24, wherein said RF power source comprises:
a power source having a voltage of 10–100 kV, and a frequency of 400–500 kHz, wherein the power density in the region between said metal plate and said substrate surface is 0.1–100 W/cm$^2$.

* * * * *